(12) United States Patent
Hikichi

(10) Patent No.: US 12,153,103 B2
(45) Date of Patent: Nov. 26, 2024

(54) SENSOR DEVICE AND SEMICONDUCTOR DEVICE INCLUDING THE SAME

(71) Applicant: ABLIC Inc., Tokyo (JP)

(72) Inventor: Tomoki Hikichi, Tokyo (JP)

(73) Assignee: ABLIC Inc., Nagano (JP)

( * ) Notice: Subject to any disclaimer, the term of this patent is extended or adjusted under 35 U.S.C. 154(b) by 136 days.

(21) Appl. No.: 18/185,374

(22) Filed: Mar. 17, 2023

(65) Prior Publication Data

US 2023/0305083 A1    Sep. 28, 2023

(30) Foreign Application Priority Data

Mar. 22, 2022   (JP) .................................. 2022-045047

(51) Int. Cl.
*G01R 33/07*    (2006.01)

(52) U.S. Cl.
CPC .................... *G01R 33/07* (2013.01)

(58) Field of Classification Search
CPC .. B64G 1/366; G01R 33/0206; G01R 33/028; G01R 33/038; G01R 33/1215
See application file for complete search history.

(56) References Cited

U.S. PATENT DOCUMENTS

| 2018/0059193 A1* | 3/2018 | Hikichi | G01R 33/0005 |
| 2020/0169360 A1* | 5/2020 | Tung | H04L 1/20 |
| 2020/0280308 A1* | 9/2020 | Gunasekaran | G01R 31/2621 |

FOREIGN PATENT DOCUMENTS

JP    H03252526    11/1991

* cited by examiner

*Primary Examiner* — Tung X Nguyen
(74) *Attorney, Agent, or Firm* — JCIPRNET

(57) ABSTRACT

A sensor device includes: a sensor element, outputting a signal; a first determination circuit, outputting an initialization signal containing a signal level corresponding to a determination result as to whether detection of a physical quantity has matched two consecutive times; a second determination circuit, including a counter which is able to, while initializing a count value if the detection of the physical quantity does not occur two consecutive times, continue counting if the detection of the physical quantity occurs two consecutive times until a set number of times is reached, the second determination circuit outputting an output latch signal containing a signal level corresponding to whether a consecutive match occurs until the set number of times is reached; and an output register, switching a signal level of an output signal supplied to an output terminal according to a change in the signal level of the output latch signal.

10 Claims, 4 Drawing Sheets

SENSOR DEVICE AND SEMICONDUCTOR DEVICE INCLUDING THE SAME

CROSS-REFERENCE TO RELATED APPLICATIONS

This application claims the priority benefit of Japan Application No. 2022-045047, filed on Mar. 22, 2022. The entirety of the above-mentioned patent application is hereby incorporated by reference herein and made a part of this specification.

BACKGROUND

Technical Field

The present invention relates to a sensor device and a semiconductor device including the sensor device.

Related Art

According to a sensor device represented by a magnetic sensor and a semiconductor device including the sensor device, by sequentially latching multiple logical outputs from a sensor or the like in a register and performing a match determination, variations in a detection and determination result due to noise are suppressed (see, for example, Japanese Patent Laid-open No. H3-252526). It is effective to increase the number of times of performing the match determination in order to increase reliability of the detection and determination result. In the circuit illustrated in FIG. 1 of Japanese Patent Laid-open No. H3-252526, the number of times of performing the match determination is set to 3 by a 2-bit register.

However, if a circuit (hereinafter referred to as a "conventional device") is configured in which the number of times of performing the match determination is increased without any plan, the area occupied by the register which latches the logic output may be significantly increased. For example, in the circuit illustrated in FIG. 1 of Japanese Patent Laid-open No. H3-252526, when the number of times of performing the match determination is "N" (N is a natural number equal to or greater than 2), an N−1 bit register is required.

SUMMARY

The present invention provides a sensor device and a semiconductor device including the sensor device, in which the area occupied by a circuit is reduced without impairing reliability of a detection and determination result.

A sensor device according to an aspect of the present invention is a sensor device which determines detection of a physical quantity by consecutive detections of the physical quantity over a plurality of times. The sensor device includes: a sensor element, outputting a detection result signal indicating a detection result of the physical quantity; a first determination circuit, determining whether detection of the physical quantity has occurred two consecutive times by this time and last time immediately before this time according to a signal level of the detection result signal, and outputting an initialization signal containing a signal level corresponding to a determination result; a second determination circuit, including a counter which is able to, while initializing a count value in response to the initialization signal indicating that the detection of the physical quantity does not occur in the two consecutive times, continue counting until a set number of times is reached, in response to the initialization signal indicating that the detection of the physical quantity occurs in the two consecutive times, in which the second determination circuit outputs an output latch signal containing a signal level corresponding to whether the count value of the counter is continuously consistent until the set number of times is reached; and an output register, switching a signal level of an output signal supplied to an output terminal according to a change in the signal level of the output latch signal.

A semiconductor device according to an aspect of the present invention includes the sensor device.

According to the sensor device and the semiconductor device, the area occupied by a circuit can be reduced without impairing reliability of a detection and determination result.

DESCRIPTION OF THE EMBODIMENTS

Hereinafter, a sensor device and a semiconductor device including the sensor device according to an embodiment of the present invention will be described with reference to the drawings.

Figure 1:
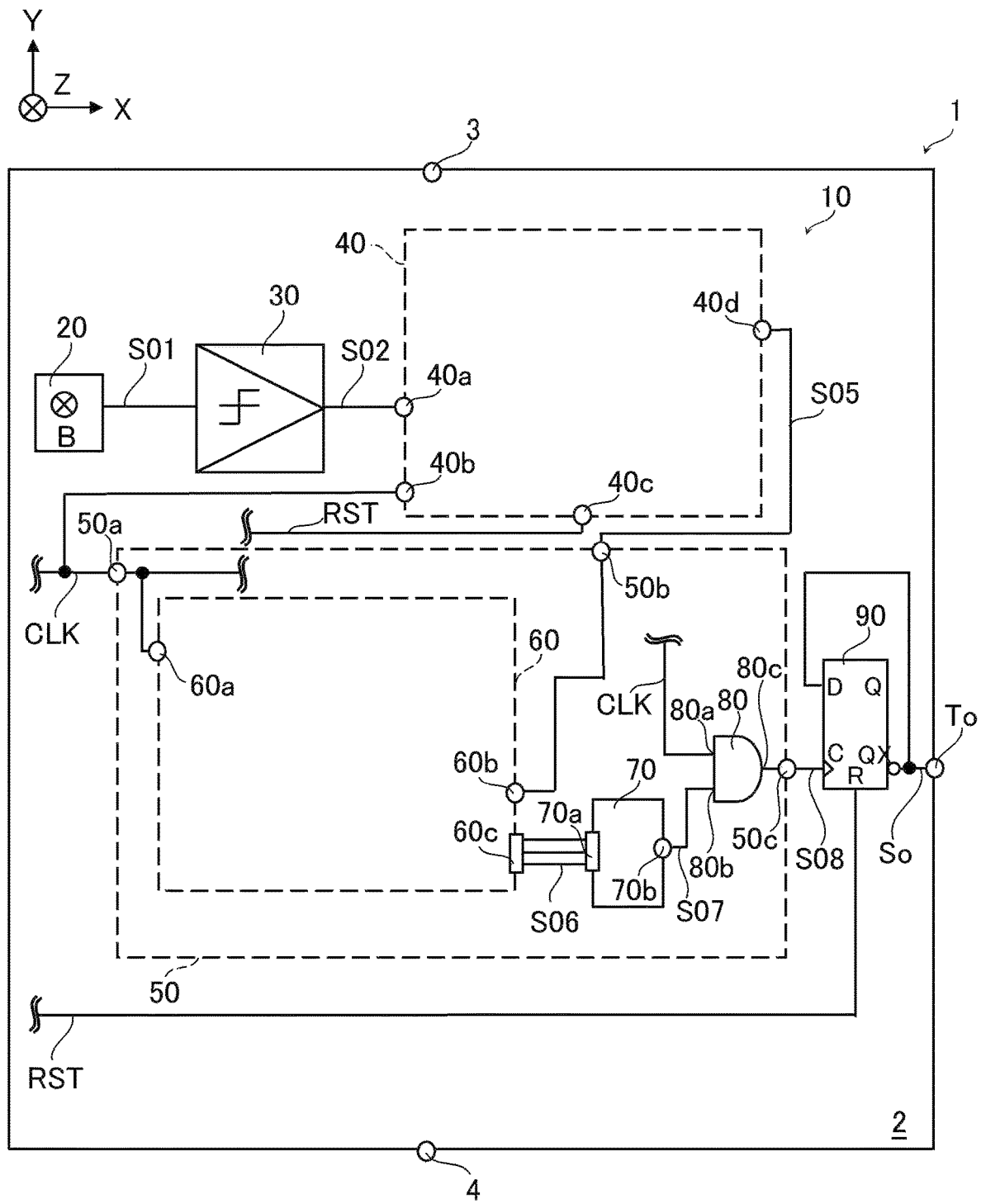
FIG. 1 is a block diagram schematically illustrating a circuit configuration example of a sensor device and a semiconductor device including the sensor device according to an embodiment of the present invention.

FIG. 1 is a block diagram illustrating a circuit configuration example of a sensor device 10 and a semiconductor device 1 which are a sensor device and a semiconductor device according to an embodiment of the present invention. Here, an X-axis, a Y-axis, and a Z-axis illustrated in FIG. 1 are coordinate axes orthogonal to each other in a three-dimensional orthogonal coordinate system. An XY plane is a surface parallel to a surface (surface on a front side of the paper surface in FIG. 1) of a semiconductor substrate 2. That is, the surface of the semiconductor substrate 2 has the Z-axis as its normal vector.

The semiconductor device 1 includes the semiconductor substrate 2 on which the sensor device 10 is formed in a semiconductor region. The semiconductor substrate 2 is provided with a power supply terminal 3 connected with a first power supply and a power supply terminal 4 connected with a second power supply.

The sensor device 10 is a device which determines detection of a physical quantity by determining that the physical quantity has been detected consecutively over a plurality of times. Here, the number of times set as an upper limit value for counting the detection of the physical quantity is defined as "N times." N is a natural number equal to or greater than 2. The sensor device 10 includes a Hall element 20, a binarization circuit 30, a determination circuit 40, a determination circuit 50, and an output register 90.

The Hall element 20 as a sensor element is an example of a magnetic sensor element. The Hall element 20 illustrated is a so-called horizontal Hall element which outputs a signal S01 corresponding to a magnetic flux density B acting in a vertical direction (that is, Z direction) on the semiconductor substrate 2.

The binarization circuit 30 is, for example, a circuit which converts the signal S01 as a detection result signal containing a low level (hereinafter referred to as "L level") and a high level (hereinafter referred to as "H level") into a binarized signal S02. The signal S02 contains two signal levels corresponding to the signal levels of the signal S01. Specifically, the signal S02 contains a signal level corresponding to whether a current pole detection state and the magnetic flux density B match. The binarization circuit 30 includes an input port connected with an output port of the Hall element 20 and an output port outputting the signal S02.

The determination circuit 40 as a first determination circuit is a circuit which, based on the signal S02 received, determines whether the detection of the magnetic flux density B as a physical quantity has occurred two consecutive times by this time and last time immediately before this time, and outputs a signal S05 containing a signal level corresponding to a determination result. The determination circuit 40 includes an input port 40a to which the signal S02 is supplied, an input port 40b to which a clock signal CLK is supplied, an input port 40c to which a reset signal RST is supplied, and an output port 40d outputting the signal S05 as an initialization signal. The input port 40a is connected with the output port of the binarization circuit 30.

The determination circuit 50 as a second determination circuit is a circuit which, based on the signal S05, outputs a signal S08 as an output latch signal. The signal S08 contains a signal level corresponding to a determination result as to whether the number of times that the detection of the magnetic flux density B has occurred two consecutive times is continuously consistent until a set number of times is reached. The determination circuit 50 includes an input port 50a to which the clock signal CLK is supplied, an input port 50b connected with the output port 40d, a counter 60, a consecutive match determination circuit 70, an AND circuit 80, and an output port 50c outputting the signal S08.

The counter 60 is configured to be able to count the number of times that the detection of the magnetic flux density B has occurred two consecutive times until the set number of times is reached. The counter 60 includes an input port 60a connected with the input port 50a, an input port 60b connected with the input port 50b, and an output port 60c outputting a signal S06 indicating a count value of the number of times that the detection of the magnetic flux density B has occurred two consecutive times. The signal S06 is a binary signal having the number of bits corresponding to a set count value.

The consecutive match determination circuit 70 includes an input port 70a connected with the output port 60c and an output port 70b outputting a signal S07 as a match determination flag signal. The signal S07 contains a signal level corresponding to the determination result as to whether the number of times that the detection of the magnetic flux density B has occurred two consecutive times is continuously consistent until the set number of times is reached. The L level of the signal S07 corresponds to, for example, a state in which the number of times that the detection of the magnetic flux density B has occurred two consecutive times is not continuously consistent until the set number of times is reached. The H level of the signal S07 corresponds to, for example, a state in which the number of times that the detection of the magnetic flux density B has occurred two consecutive times is continuously consistent until the set number of times is reached.

The consecutive match determination circuit 70 is configured to include, for example, a decoder outputting the signal S07 in accordance with a preset rule with respect to the signal S06 received. In the decoder in the consecutive match determination circuit 70, a 3-bit value of (000b) to (111b) grasped from the signal S06 is associated with the signal level of the signal S07. The decoder in the consecutive match determination circuit 70 is configured to output the signal S07 containing a signal level corresponding to a value grasped from the signal S06.

The AND circuit 80 as a first AND circuit includes a first input port 80a to which the clock signal CLK is supplied, a second input port 80b connected with the output port 70b, and an output port 80c connected with the output port 50c.

The output register 90 is configured to include, for example, a D flip-flop (hereinafter referred to as "D-FF") circuit of a rising edge type. The D-FF circuit of the output register 90 includes a first input port D, a second input port C connected with the output port 80c, a reset signal input port R to which the reset signal RST is supplied, a first output port Q outputting a positive logic signal, and a second output port QX outputting a negative logic signal. The first input port D is connected with the second output port QX and an output terminal To.

Next, a more detailed circuit configuration example of the determination circuit 40 and the counter 60 is described.

Figure 2:
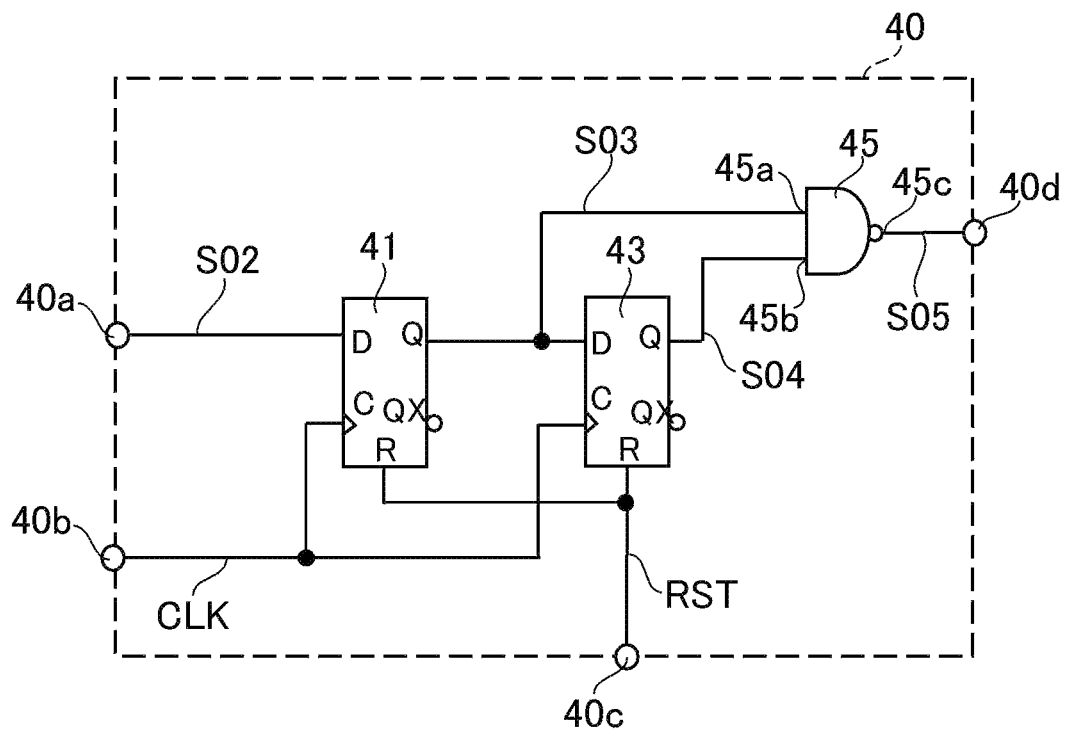
FIG. 2 is a block diagram schematically illustrating a circuit configuration example of a first determination circuit of the sensor device and the semiconductor device including the sensor device according to the present embodiment.
Figure 3:
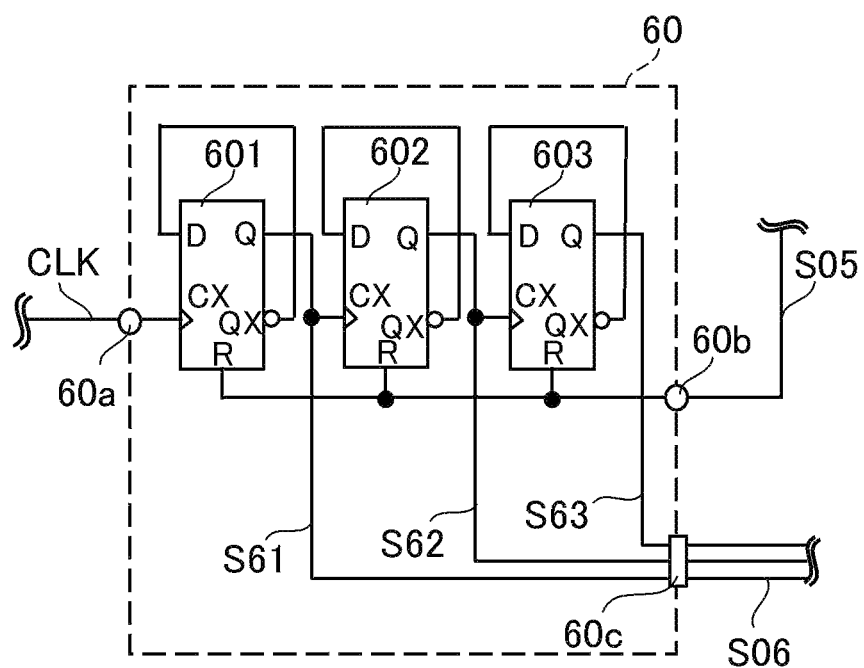
FIG. 3 is a block diagram schematically illustrating a circuit configuration example of a counter in a second determination circuit of the sensor device and the semiconductor device including the sensor device according to the present embodiment.

FIG. 2 is a block diagram illustrating a circuit configuration example of the determination circuit 40. FIG. 3 is a block diagram illustrating a circuit configuration example of the counter 60.

In addition to the input ports 40a, 40b, 40c and output port 40d, the determination circuit 40 further includes, for example, D-FF circuits 41 and 43 of a rising edge type, as well as a NAND circuit 45 including a first input port 45a, a second input port 45b, and an output port 45c.

The D-FF circuit 41 as a first flip-flop circuit is a circuit which, based on the signal S02 and the clock signal CLK, outputs a signal S03 which is a first hold signal containing two signal levels corresponding to a determination result as to detection of the magnetic flux density B of the last time. The D-FF circuit 43 as a second flip-flop circuit is a circuit which, based on the signal S03 and the clock signal CLK, outputs a signal S04 which is a second hold signal containing two signal levels corresponding to a determination result as to detection of the magnetic flux density B of one time (hereinafter simply referred to as "previous time") previous to the last time.

Here, the signal S03 contains, for example, the signal levels including the L level corresponding to a determination result that the detection of the magnetic flux density B of the last time is not determined, and the H level corresponding to a determination result that the detection of the magnetic flux density B of the last time is determined. The signal S04 contains, for example, the signal levels including the L level corresponding to a determination result that the detection of the magnetic flux density B of the previous time is not determined, and the H level corresponding to a determination result that the detection of the magnetic flux density B of the previous time is determined.

Each of the D-FF circuit 41 and the D-FF circuit 43 includes the first input port D, the second input port C, the reset signal input port R, the first output port Q outputting a positive logic signal, and the second output port QX outputting a negative logic signal.

In the D-FF circuit 41, the first input port D is connected with the input port 40a. The second input port C is connected with the input port 40b. The reset signal input port R is connected with the input port 40c. The first output port Q as an output port of the first flip-flop circuit is connected with the first input port D of the D-FF circuit 43 and the first input port 45a. In the D-FF circuit 43, the first input port D is connected with the first output port Q of the D-FF circuit 41 and the first input port 45a. The second input port C is connected with the input port 40b. The reset signal input port R is connected with the input port 40c. The first output port Q as an output port of the second flip-flop circuit is connected with the second input port 45b.

In the NAND circuit 45, the first input port 45a is connected with the first output port Q of the D-FF circuit 41 and the first input port D of the D-FF circuit 43. The second input port 45b is connected with the first output port Q of the D-FF circuit 43. The output port 45c is connected with the output port 40d.

The counter 60 is configured as a 3-bit counter which further includes three D-FF circuits 601 to 603 of a falling edge type in addition to the input ports 60a, 60b and output port 60c. That is, if described using a natural number k, in the case where the counter 60 is configured as a k-bit counter, the counter 60 includes at least k flip-flop circuits.

A relationship of the following equation (1) is established between the natural number k and the natural number N which represents the upper limit value for counting the detection of the physical quantity.

$$k=\text{ceiling}(\log_2 N) \quad (1)$$

Here, ceiling($\log_2 N$) is a ceiling function representing, for a real number $\log_2 N$, a minimum integer equal to or greater than $\log_2 N$. For example, if N=3 or 4, k=2. If N=5, 6, 7, or 8, k=3.

Each of the D-FF circuits 601 to 603 includes the first input port D, a second input port CX, the reset signal input port R, the first output port Q outputting a positive logic signal, and the second output port QX outputting a negative logic signal. In the counter 60, the D-FF circuit 601 corresponds to the first bit counted from the smallest bit, that is, the least significant bit (LSB). The D-FF circuit 602 corresponds to the second bit counted from the smallest bit, that is, the middle bit. The D-FF circuit 603 corresponds to the third bit counted from the smallest bit, that is, the most significant bit (MSB).

The first output port Q of the D-FF circuit 601 is connected with the output port 60c via a signal line which supplies a signal S61 containing a signal level corresponding to 0 and 1 of the least significant bit. The first output port Q of the D-FF circuit 602 is connected with the output port 60c via a signal line which supplies a signal S62 containing a signal level corresponding to 0 and 1 of the second bit counted from the smallest bit. The first output port Q of the D-FF circuit 603 is connected with the output port 60c via a signal line which supplies a signal S63 containing a signal level corresponding to 0 and 1 of the most significant bit.

Next, characteristics of the sensor device 10 and the semiconductor device 1, specifically, a relationship of the signal S02 relative to the magnetic flux density B and a relationship of an output signal So relative to the magnetic flux density B, are described.

Figure 4A:
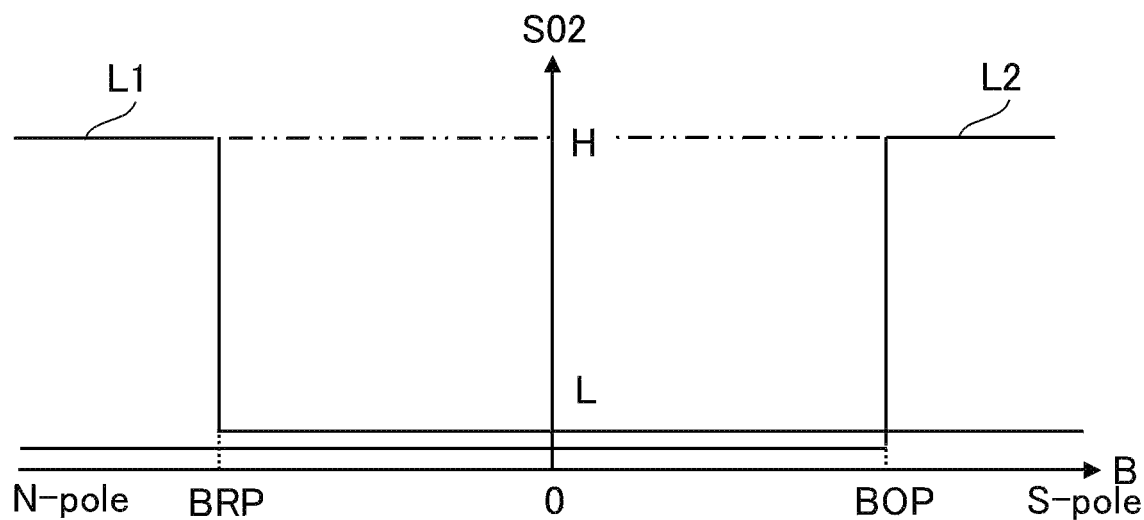
FIG. 4A is a relationship diagram illustrating a relationship of a binarized signal of a detection result signal relative to a magnetic flux density of the sensor device and the semiconductor device including the sensor device according to the present embodiment.

FIG. 4A is a relationship diagram illustrating the relationship of the signal S02 relative to the magnetic flux density B of the sensor device 10 and the semiconductor device 1.

Here, a horizontal axis of FIG. 4A indicates the magnetic flux density B expressed with the S-pole as the positive direction. That is, a negative region (B<0) on the left side of a vertical axis (B=0) corresponds to the N-pole, and a positive region (B>0) on the right side corresponds to the S-pole. Solid line L1 and solid line L2 illustrated in FIG. 4A respectively correspond to a case where the output signal So is at the L level and a case where the output signal So is at the H level, that is, a S-pole detection state and an N-pole detection state of the sensor device 10. Further, BRP and BOP respectively indicate a magnetic flux density serving as a release point and a magnetic flux density serving as an operate point. In the description of the present embodiment, the magnetic flux density serving as the release point and the magnetic flux density serving as the operate point are respectively referred to as the release point BRP and the operate point BOP.

According to FIG. 4A, in the S-pole detection state, in response to the magnetic flux density B being less than the release point BRP as indicated by solid line L1, that is, in response to the magnetic flux density B being large on the N-pole side, the signal S02 at the H level corresponding to detection of the magnetic flux density B is output. On the other hand, in response to the magnetic flux density B being equal to or greater than the release point BRP, that is, in response to the magnetic flux density B being not large on the N-pole side, the signal S02 at the L level corresponding to non-detection of the magnetic flux density B is output. In short, the S-pole detection state is a state of waiting for detection of a strong magnetic field of the N-pole opposite to the S-pole.

In the N-pole detection state, in response to the magnetic flux density B being greater than the operate point BOP as indicated by solid line L2, the signal S02 at the H level corresponding to detection of the magnetic flux density B is output. On the other hand, in response to the magnetic flux density B being equal to or less than the operate point BOP, the signal S02 at the L level corresponding to non-detection of the magnetic flux density B is output. In short, the N-pole detection state is a state of waiting for detection of a strong magnetic field of the S-pole opposite to the N-pole.

Figure 4B:
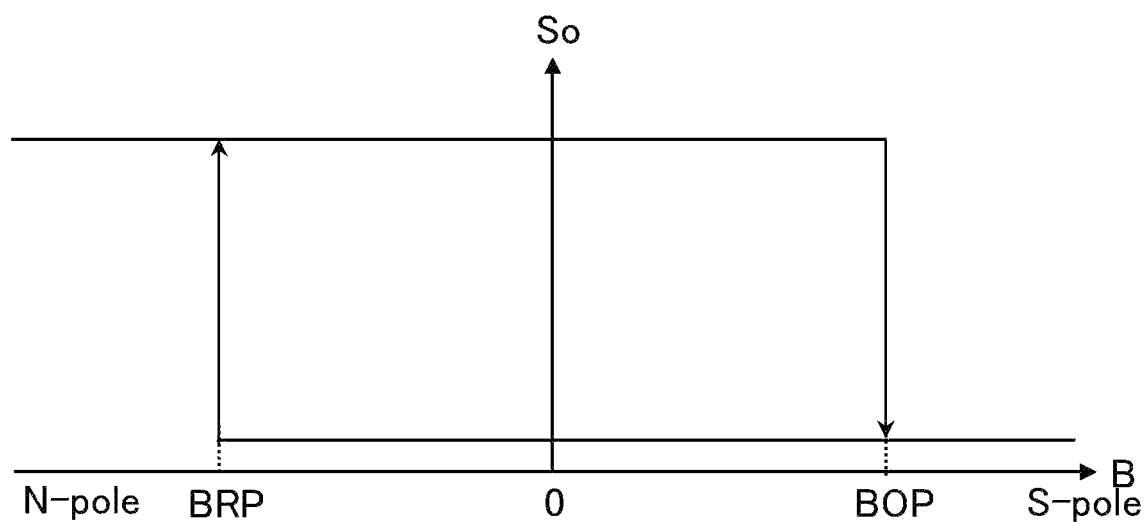
FIG. 4B is a relationship diagram illustrating a relationship of an output signal relative to a magnetic flux density of the semiconductor device according to the present embodiment.

FIG. 4B is a relationship diagram illustrating the relationship of the output signal So relative to the magnetic flux density B of the sensor device 10 and the semiconductor device 1.

According to FIG. 4B, the negative region (B<0) on the left side of the vertical axis (B=0) corresponds to the N-pole, and the positive region (B>0) on the right side corresponds to the S-pole. The N-pole detection state corresponds to the H level of the output signal So. During the N-pole detection state, the H level of the output signal So, that is, the N-pole detection state, is maintained as long as the operate point BOP located on the S-pole side (B>0) is not exceeded. In response to the magnetic flux density B varying in an increasing direction (rightward direction in FIG. 4B) and exceeding the operate point BOP, the state transitions from the N-pole detection state to the S-pole detection state.

On the other hand, the S-pole detection state corresponds to the L level of the output signal So. During the S-pole detection state, the L level of the output signal So, that is, the S-pole detection state, is maintained as long as the release point BRP located on the N-pole side (B<0) is not exceeded on the negative side. In response to the magnetic flux density B varying in a decreasing direction (leftward direction in FIG. 4B) and exceeding the release point BRP on the negative side, the state transitions from the S-pole detection state to the N-pole detection state.

Next, an operation of the sensor device 10 and the semiconductor device 1 is described. First, an outline of the operation of the sensor device 10 and the semiconductor device 1 is described with reference to FIG. 1 to FIG. 4B.

The semiconductor device 1 operates with the power supply terminal 3 and the power supply terminal 4 respectively connected to the first power supply and the second power supply. A first power supply voltage is supplied from the power supply terminal 3. A second power supply voltage is supplied from the power supply terminal 4. The first power supply voltage and the second power supply voltage are respectively supplied to the sensor device 10 and a circuit (not illustrated) within the semiconductor device 1.

The sensor device 10 is configured to output, for example, the output signal So at the H level, in the N-pole detection state in which a strong magnetic field (B<BRP) on the N-pole side is detected, and output, for example, the output signal So at the L level, in the S-pole detection state in which a strong magnetic field (B>BOP) on the S-pole side is detected. In the sensor device 10, the signal S01 corresponding to the magnetic flux density B acting from the outside is output from the Hall element 20. The signal S01 is converted into the binarized signal S02 by the binarization circuit 30.

The two levels contained in the signal S02 correspond to whether the current pole detection state and the magnetic flux density B match. For example, the L level corresponds to a state in which the current pole detection state and the magnetic flux density B match. The H level corresponds to a state in which the current pole detection state and the magnetic flux density B do not match. In this example, in response to the signal S02 transitioning from the L level to the H level, detection determination of a strong magnetic field of an opposite pole is started with respect to the current pole detection state.

The signal S02, the clock signal CLK, and the reset signal RST are supplied to the determination circuit 40 from the input port 40a, the input port 40b, and the input port 40c, respectively. In the determination circuit 40, the signal S02 is supplied to the first input port D of the D-FF circuit 41. The clock signal CLK is supplied to each second input port C of the D-FF circuit 41 and the D-FF circuit 43. The reset signal RST is supplied to each reset signal input port R of the D-FF circuit 41 and the D-FF circuit 43.

The D-FF circuit 41 receives the signal S02 and the clock signal CLK, and supplies the signal S03 from the first output port Q to the first input port D of the D-FF circuit 43 and the first input port 45a. The D-FF circuit 43 receives the signal S03 and the clock signal CLK, and supplies the signal S04 from the first output port Q to the second input port 45b. That is, the D-FF circuit 41 operates as a shift register which delays a timing of the signal S02. The D-FF circuit 43 operates as a shift register which delays a timing of the signal S03. The NAND circuit 45 performs a NAND operation on the signals S03 and S04 supplied, and supplies from the output port 45c to the output port 40d the signal S05 containing a signal level corresponding to an operation result.

If each of the signals S03 and S04 is at the L level, the signal S05 contains a signal level at the H level; if otherwise, the signal S05 contains a signal level at the L level. The H level of the signal S05 corresponds to, for example, execution of initialization, and the L level of the signal S05 corresponds to, for example, non-execution of initialization. The signal S05 is supplied from the output port 40d to the input port 50b. That is, the signal S05 is supplied from the determination circuit 40 to the determination circuit 50.

The clock signal CLK and the signal S05 are supplied to the determination circuit 50 from the input port 50a and the input port 50b, respectively. In the determination circuit 50, the clock signal CLK and the signal S05 are supplied to the counter 60 via the input port 60a and the input port 60b, respectively.

In the counter 60, the clock signal CLK is supplied to each second input port CX of the D-FF circuits 601 to 603. The signal S05 is supplied to each reset signal input port R of the D-FF circuits 601 to 603. Each time the clock signal CLK falls, the D-FF circuits 601 to 603 supply the signals S61 to S63 from the first output ports Q of the D-FF circuits 601 to 603 to the output port 60c.

The D-FF circuits 601 to 603 continue counting until the signal S05 at the H level is received, that is, during a period during which the signal S05 at the L level is being received. On the other hand, the D-FF circuits 601 to 603 initialize a value of each of the D-FF circuits 601 to 603 upon receiving the signal S05 at the H level. That is, the count value of the counter 60 returns to 0. The signals S61 to S63 supplied from the first output ports Q of the D-FF circuits 601 to 603 to the output port 60c are supplied from the output port 60c to the input port 70a as the signal S06 which is a single binary signal. That is, the signal S06 is supplied from the counter 60 to the consecutive match determination circuit 70.

The consecutive match determination circuit 70 supplies from the output port 70b to the second input port 80b the signal S07 containing a signal level corresponding to a value grasped from the signal S06 supplied from the input port 70a. That is, the signal S07 is supplied from the consecutive match determination circuit 70 to the AND circuit 80.

The clock signal CLK and the signal S07 are supplied to the AND circuit 80 from the first input port 80a and the second input port 80b, respectively. The AND circuit 80 performs an AND operation on the clock signal CLK and the signal S07 supplied, and supplies from the output port 80c to the output port 50c the signal S08 containing a signal level corresponding to an operation result.

According to the example of the signal S07 described above, since the state in which the number of times that the detection of the magnetic flux density B has occurred two consecutive times is not continuously consistent until the set number of times is reached corresponds to the L level, the L level of the signal S08 indicates that the number of times that the detection of the magnetic flux density B has occurred two consecutive times is not continuously consistent until the set number of times is reached. On the other hand, the H level of the signal S08 indicates that the number of times that the detection of the magnetic flux density B has occurred two consecutive times is continuously consistent until the set number of times is reached. The signal S08 supplied to the output port 50c is supplied from the output port 50c to the output register 90, more specifically, to the second input port C of the D-FF circuit of the output register 90.

In response to the signal level of the signal S08 supplied being the H level, the output register 90 toggles; in response to the signal level of the signal S08 being the L level, a current state is maintained. That is, if the signal level of the signal S08 is the H level and the signal level of the output signal So is the L level, the output register 90 causes the output signal So to transition to the H level; if the signal level of the signal S08 is the H level and the signal level of the output signal So is the H level, the output register 90 causes the output signal So to transition to the L level. As illustrated in FIG. 4B, the L level and the H level of the output signal So respectively correspond to the S-pole detection state and the N-pole detection state.

Next, an operation timing of the sensor device 10 and the semiconductor device 1 is described.

Figure 5:
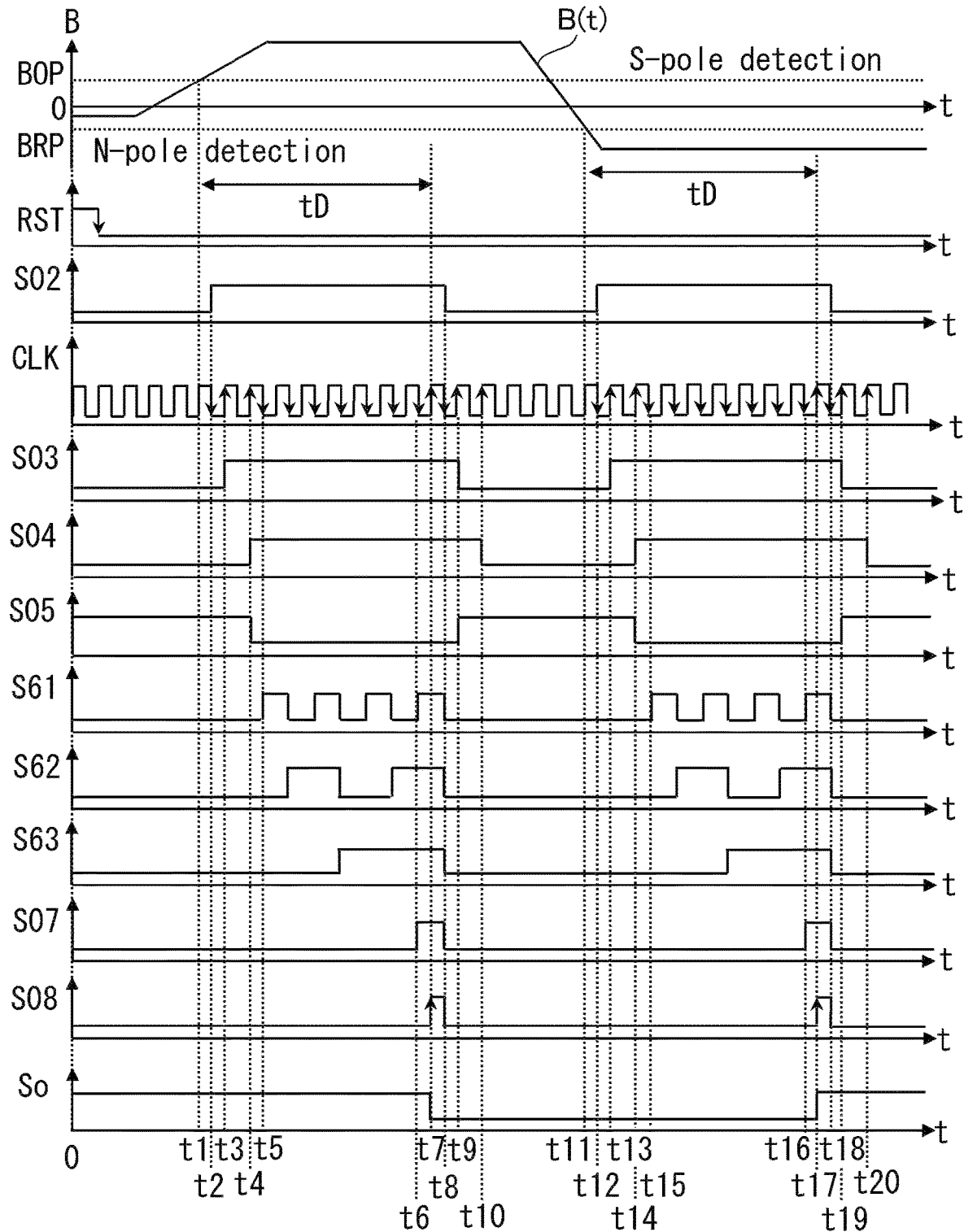
FIG. 5 is a timing diagram of the semiconductor device according to the present embodiment.

FIG. 5 is a timing diagram of the sensor device 10 and the semiconductor device 1. The timing diagram of FIG. 5 includes 13 graphs with a common axis as time starting at t=0 on the horizontal axis. For the 13 graphs included in FIG. 5, the vertical axis indicates, from top to bottom, the magnetic flux density B, the reset signal RST, the signal S02, the clock signal CLK, the signal S03, the signal S04, the signal S05, the signal S61, the signal S62, the signal S63, the signal S07, the signal S08 and the output signal So.

Here, prior to the description, a value at t=0 is referred to as an initial value. A time from when the magnetic flux density B upwardly exceeds the operate point BOP to when a transition to the S-pole detection state actually occurs and a time from when the magnetic flux density B downwardly exceeds the release point BRP to when a transition to the S-pole detection state actually occurs is referred to as a "delay time tD." Further, the magnetic flux density B being a function of time t is denoted as "B(t)" in FIG. 5. As illustrated in FIG. 5, taking as an example a case where the magnetic flux density B varies with the time t, an operation and an operation timing of the Hall element 20, the binarization circuit 30, the determination circuit 40, the determination circuit 50, and the output register 90 are described.

Since the initial value of the output signal So is at the H level, the sensor device 10 is in the N-pole detection state. The initial value of the magnetic flux density B is a weak magnetic field (BRP<B<0) on the N-pole side. The initial values of the reset signal RST, the signal S02, the clock signal CLK, the signal S03, the signal S04, the signal S05, the signal S61, the signal S62, the signal S63, the signal S07, and the signal S08 are at the H level, the L level, the H level, the L level, the L level, the H level, the L level, the L level, the L level, the L level, and the L level, respectively.

When time has elapsed from t=0, before t=t1 is reached, at a time at which the reset signal RST transitions from the H level to the L level and falls, reset of the D-FF circuits 41 and 43 and the D-FF circuit of the output register 90 is released.

The magnetic flux density B continues to increase from the negative region (N-pole side) to the positive region (S-pole side), and the magnetic flux density B exceeds the operate point BOP at t=t1. In response to the magnetic flux density B upwardly exceeding the operate point BOP, at t=t2 at which the clock signal CLK falls immediately thereafter, the signal S02 transitions from the L level to the H level. In response to the signal S02 transitioning to the H level, at t=t3 at which the clock signal CLK rises immediately thereafter, the signal S03 transitions from the L level to the H level. That is, determination in the determination circuit 40 of two consecutive times of detection is started.

In response to the signal S02 remaining at the H level and the signal S03 transitioning to the H level, at t=t4 at which the clock signal CLK rises immediately thereafter, the signal S04 transitions from the L level to the H level. At t=t4, since both the signal S03 and the signal S04 are at the H level, the signal S05 transitions from the H level to the L level. That is, the signal S05 at the L level is supplied from the determination circuit 40 to the determination circuit 50.

In response to the signal S05 transitioning to the L level, at t=t5 at which the clock signal CLK falls immediately thereafter, counting by the counter 60, that is, counting by the D-FF circuits 601 to 603, is started. Specifically, the D-FF circuit 601 outputs the signal S61 at a signal level corresponding to 1 at t=t5 at which the clock signal CLK falls. The D-FF circuit 602 outputs the signal S62 corresponding to 0. The D-FF circuit 603 outputs the signal S63 corresponding to 0. That is, in response to the signal S05 remaining at the L level and the counter 60 receiving the clock signal CLK, the counter 60 increases the count value each time the clock signal CLK falls.

At t=t6 at which the clock signal CLK falls, the signal S61 at the signal level corresponding to 1, the signal S62 at the signal level corresponding to 1, and the signal S63 at the signal level corresponding to 1 are output from the D-FF circuits 601, 602, and 603. That is, the counter 60 outputs the signal S06 containing the signal level (111b) corresponding to a count value of 7. The fact that the signal S06 contains the signal level (111b) indicates that detection of a strong magnetic field (B>BOP) in which the magnetic flux density B is on the S-pole side has been determined 8 times. At t=t6, the signal S07 transitions from the L level to the H level.

At t=t7 at which the clock signal CLK rises immediately after t=t6, as the signal S08 transitions from the L level to the H level, the output signal So transitions from the H level to the L level. That is, the sensor device 10 transitions from the N-pole detection state to the S-pole detection state. At t=t8 at which the clock signal CLK falls immediately after a transition of the pole detection state of the sensor device 10, the signal S02 transitions from the H level to the L level. At t=t8, since both the signal S03 and the signal S04 are maintained at the H level, the signal S05 is maintained at the L level. Since the signal S05 is maintained at the L level, the counting operation of the counter 60 continues, and each of the signals S61, S62 and S63 transitions from the signal level corresponding to 1 to the signal level corresponding to 0. Further, at t=t8, the signal S08 transitions from the H level to the L level.

At t=t9 at which the clock signal CLK rises immediately after t=t8, the signal S03 transitions from the H level to the L level. On the other hand, the signal S04 is maintained at the H level. In response to the signal S03 transitioning to the L level, since the result of the NAND operation on the signals S03 and S04 is at the H level, the signal S05 transitions from the L level to the H level. In response to the signal S05 transitioning to H level, the D-FF circuits 601 to 603 are initialized.

At t=t10 at which the clock signal CLK rises following the rise of the clock signal CLK at t=t9, the signal S04 transitions from the H level to the L level. In response to the signal S04 transitioning to the L level, since the result of the NAND operation on the signals S03 and S04 is maintained at the H level, the signal S05 is maintained at the L level.

After t=t10, the magnetic flux density B decreases from the state of exceeding the operate point BOP located in the positive region (S-pole side). Then, at t=t11, the magnetic flux density B downwardly exceeds the release point BRP located in the negative region (N-pole side) from above. The magnetic flux density B at and after t=t11 changes below the release point BRP, that is, on the N-pole detection side.

At t=t12 at which the clock signal CLK falls immediately after the magnetic flux density B has downwardly exceeded the release point BRP, the signal S02 transitions from the L level to the H level. The operation from t=t12 to t=t16 is the same as the operation from t=t2 to t=t6 described above. However, the signal S06 at t=t16 indicates that detection of a strong magnetic field (B<BRP) in which the magnetic flux density B is on the N-pole side has been determined 8 times. At t=t17 at which the clock signal CLK rises immediately after t=t16, as the signal S08 transitions from the L level to the H level, the output signal So transitions from the L level to the H level. That is, the sensor device 10 transitions from the S-pole detection state to the N-pole detection state. The operation from t=t18 to t=t20 is the same as the operation from t=t8 to t=t10 described above.

As described above, according to the invention according to the present embodiment, a configuration of a register for performing N times of match determination includes the first determination circuit which performs determination at a first stage and a second determination circuit which performs determination at a second stage. The determination at the first stage is to determine whether a detected state of a physical quantity matches two consecutive times. The determination at the second stage is to determine whether the number of times that the detected state of the physical quantity matches is continuously consistent until the set number of times is reached. Thus, in the case where N times can be expressed by a power of 2 times, that is, by $N=2^m$ times using a natural number m, the register for performing N times of match determination can be configured by m+2 flip-flop circuits.

On the other hand, in the conventional device described above, a register for performing N times of match determination can be configured using N−1 flip-flop circuits. Here, the invention according to the present embodiment and the conventional device are compared by taking as an example a case where m=3. In the case where m=3, that is, $N=2^3=8$, the conventional device requires 7 (=8-1) flip-flop circuits. In contrast, the invention according to the present embodiment can be configured using 5 (=3+2) flip-flop circuits. In this way, according to the invention according to the present embodiment, the number of circuits required for match determination can be reduced while at least the number of times of performing the match determination is maintained. Thus, according to the invention according to the present embodiment, the area occupied by a circuit can be reduced without impairing reliability of a detection and determination result.

According to the invention according to the present embodiment, compared to the conventional device, the effect of reducing the area occupied by the circuit becomes pronounced as the natural number N being the number of times of match determination increases. Taking as an example the case where m=4 or 5, if m=4, that is, if $N=2^4=16$, the conventional device requires 15 (=16-1) flip-flop circuits. On the other hand, the invention according to the present embodiment can be configured using 6 (=4+2) flip-flop circuits. If m=5, that is, if $N=2^5=32$, the conventional device requires 31 (=32-1) flip-flop circuits. On the other hand, the invention according to the present embodiment can be configured using 7 (=5+2) flip-flop circuits.

According to the invention of the present embodiment, in the case where the same number of flip-flop circuits as the conventional device are used, the number of times of determination can be increased compared to the conventional device. For example, in the case where the sensor device 10 is configured using 7 flip-flop circuits, the number of times of determination can be increased to N=32.

The present invention is not limited to the above-described embodiment as it is, and can be implemented in various other forms other than the above-described example in an implementation stage. Various omissions, additions, replacements, or modifications can be made without departing from the scope of the invention.

For example, a logic circuit applied to the sensor device and the semiconductor device according to the present embodiment, such as the NAND circuit 45 or the AND circuit 80, is not limited to the illustrated configuration as long as an output signal with respect to an input signal, that is, a logical operation result, is not different. That is, the logic circuit applied to the sensor device and the semiconductor device according to the present embodiment may have any internal configuration as long as a logical operation result is not different.

In the above-described embodiment, an example has been described in which the consecutive match determination circuit 70 is configured to include a decoder. However, the present invention is not limited thereto. In the case where the natural number N equal to or greater than 2 can be expressed by a power of 2, that is, $N=2^m$ using the natural number m, the consecutive match determination circuit 70 may be configured to include an AND circuit as a second AND circuit including m input ports.

Since the AND circuit can be configured more simply than the decoder, the consecutive match determination circuit 70 which includes the AND circuit instead of the decoder can be configured to have smaller area than the consecutive match determination circuit 70 which includes the decoder. In the case where $N=2^m$ is established, since the natural number N is a maximum value enabling counting by m flip-flop circuits, the number of times that the counter 60 of the same area is able to count can be maximized.

In the above-described embodiment, a semiconductor device including a horizontal Hall element has been described. However, the sensor element is not limited to a horizontal Hall element or a magnetic sensor. In the present embodiment, the sensor element is not limited to a horizontal Hall element, and may be, for example, a vertical Hall element outputting the signal S01 corresponding to the magnetic flux density B in a direction parallel to the XY plane, such as the X direction. The sensor element is not limited to a Hall element, and may be configured to include a magnetic sensor element other than a Hall element, such as, for example, a magnetoresistive (MR) element, a magnetic impedance (MI) element, and a fluxgate sensor. Furthermore, the sensor element may be various sensor elements which are able to detect physical quantities other than magnetism, such as temperature, humidity, pressure, light such as ultraviolet light, visible light and infrared light, and radiation.

These embodiments or modifications thereof are included in the scope or gist of the invention, as well as in the scope of the invention described in the claims and the equivalent scope thereof.

What is claimed is:

1. A sensor device which determines detection of a physical quantity by consecutive detections of the physical quantity over a plurality of times, the sensor device comprising:
   a sensor element, outputting a detection result signal indicating a detection result of the physical quantity;
   a first determination circuit, determining whether detection of the physical quantity has occurred two consecutive times by this time and last time immediately before this time according to a signal level of the detection result signal, and outputting an initialization signal containing a signal level corresponding to a determination result;

a second determination circuit, comprising a counter which is able to, while initializing a count value in response to the initialization signal indicating that the detection of the physical quantity does not occur in the two consecutive times, continue counting until a set number of times is reached, in response to the initialization signal indicating that the detection of the physical quantity occurs in the two consecutive times, wherein the second determination circuit outputs an output latch signal containing a signal level corresponding to whether the count value of the counter is continuously consistent until the set number of times is reached; and an output register, switching a signal level of an output signal supplied to an output terminal according to a change in the signal level of the output latch signal.

2. The sensor device according to claim 1, wherein the first determination circuit comprises:
   an input port, to which a signal binarized according to the signal level of the detection result signal is supplied;
   an output port, outputting the initialization signal;
   a first flip-flop circuit, comprising a first input port connected with the input port of the first determination circuit, a second input port to which a clock signal is supplied, and an output port outputting a signal containing a signal level corresponding to a signal level of a signal supplied to the first input port and the second input port of the first flip-flop circuit;
   a second flip-flop circuit, comprising a first input port connected with the output port of the first flip-flop circuit, a second input port to which a clock signal is supplied, and an output port outputting a signal containing a signal level corresponding to a signal level of a signal supplied to the first input port and the second input port of the second flip-flop circuit; and
   a NAND circuit, comprising a first input port connected with the output port of the first flip-flop circuit and the first input port of the second flip-flop circuit, a second input port connected with the output port of the second flip-flop circuit, and an output port connected with the output port of the first determination circuit.

3. The sensor device according to claim 2, wherein the second determination circuit comprises:
   an output terminal, connected with the output register;
   the counter, comprising an output port outputting a signal indicating a count value obtained by counting number of times that a match occurs in the two consecutive times;
   a consecutive match determination circuit, comprising an input port connected with the output port of the counter, and an output port outputting a match determination flag signal based on the count value, the match determination flag signal containing a signal level corresponding to a determination result as to whether a match consecutively occurs until the set number of times is reached; and
   a first AND circuit, comprising a first input port to which a clock signal is supplied, a second input port connected with the output port of the consecutive match determination circuit, and an output port connected with the output terminal of the second determination circuit, wherein the first AND circuit supplies from the output port of the first AND circuit to the output terminal of the second determination circuit, as the output latch signal, a signal containing a signal level corresponding to a result of an AND operation on the match determination flag signal and the clock signal supplied.

4. The sensor device according to claim 3, wherein the consecutive match determination circuit comprises a decoder in which an association is made between the signal level of the match determination flag signal and the count value grasped from the signal indicating the count value, and the decoder outputs the output latch signal containing a signal level corresponding to the count value according to the association.

5. The sensor device according to claim 3, wherein, in a case of number of the plurality of times being a power of 2 equal to or greater than 2,
the consecutive match determination circuit comprises a second AND circuit comprising an input port connected with the output port of the counter and provided in a same number as bits of the counter, and an output port performing an AND operation on a signal supplied to each input port and outputting the signal.

6. The sensor device according to claim 1, wherein the second determination circuit comprises:
   an output terminal, connected with the output register;
   the counter, comprising an output port outputting a signal indicating a count value obtained by counting number of times that a match occurs in the two consecutive times;
   a consecutive match determination circuit, comprising an input port connected with the output port of the counter, and an output port outputting a match determination flag signal based on the count value, the match determination flag signal containing a signal level corresponding to a determination result as to whether a match consecutively occurs until the set number of times is reached; and
   a first AND circuit, comprising a first input port to which a clock signal is supplied, a second input port connected with the output port of the consecutive match determination circuit, and an output port connected with the output terminal of the second determination circuit, wherein the first AND circuit supplies from the output port of the first AND circuit to the output terminal of the second determination circuit, as the output latch signal, a signal containing a signal level corresponding to a result of an AND operation on the match determination flag signal and the clock signal supplied.

7. The sensor device according to claim 6, wherein the consecutive match determination circuit comprises a decoder in which an association is made between the signal level of the match determination flag signal and the count value grasped from the signal indicating the count value, and the decoder outputs the output latch signal containing a signal level corresponding to the count value according to the association.

8. The sensor device according to claim 6, wherein, in a case of number of the plurality of times being a power of 2 equal to or greater than 2,
the consecutive match determination circuit comprises a second AND circuit comprising an input port connected with the output port of the counter and provided in a same number as bits of the counter, and an output port performing an AND operation on a signal supplied to each input port and outputting the signal.

9. The sensor device according to claim 1, wherein
the counter comprises at least k flip-flop circuits, and
in a case of k being a natural number and N being a natural number representing the number of the plurality of times,
k is expressed using a ceiling function ceiling($\log_2 N$) representing, for a real number $\log_2 N$, a minimum integer equal to or greater than $\log_2 N$, $k = \text{ceiling}(\log_2 N)$ 10. A semiconductor device comprising a sensor device, wherein
the sensor device determines detection of a physical quantity by consecutive detections of the physical quantity over a plurality of times, and comprises:
a sensor element, outputting a detection result signal indicating a detection result of the physical quantity;
a first determination circuit, determining whether detection of the physical quantity has occurred two consecutive times by this time and last time immediately before this time according to a signal level of the detection result signal, and outputting an initialization signal containing a signal level corresponding to a determination result;
a second determination circuit, comprising a counter which is able to, while initializing a count value in response to the initialization signal indicating that the detection of the physical quantity does not occur in the two consecutive times, continue counting until a set number of times is reached, in response to the initialization signal indicating that the detection of the physical quantity occurs in the two consecutive times, wherein the second determination circuit outputs an output latch signal containing a signal level corresponding to whether the count value of the counter is continuously consistent until the set number of times is reached; and
an output register, switching a signal level of an output signal supplied to an output terminal according to a change in the signal level of the output latch signal,
and wherein the semiconductor device further comprises a semiconductor substrate on which the sensor device is formed.

* * * * *